United States Patent
Gardner et al.

(10) Patent No.: US 10,483,319 B2
(45) Date of Patent: Nov. 19, 2019

(54) PIXILATED DISPLAY DEVICE BASED UPON NANOWIRE LEDS AND METHOD FOR MAKING THE SAME

(71) Applicant: GLO AB, Lund (SE)

(72) Inventors: Nathan Gardner, Sunnyvale, CA (US); Ronald Kaneshiro, Los Altos, CA (US); Daniel Bryce Thompson, Palo Alto, CA (US); Fariba Danesh, Pleasanton, CA (US); Martin Schubert, Sunnyvale, CA (US)

(73) Assignee: GLO AB, Lund (SE)

( * ) Notice: Subject to any disclaimer, the term of this patent is extended or adjusted under 35 U.S.C. 154(b) by 285 days.

(21) Appl. No.: 15/502,484

(22) PCT Filed: Aug. 6, 2015

(86) PCT No.: PCT/US2015/044049
§ 371 (c)(1),
(2) Date: Feb. 7, 2017

(87) PCT Pub. No.: WO2016/022824
PCT Pub. Date: Feb. 11, 2016

(65) Prior Publication Data
US 2017/0221963 A1    Aug. 3, 2017

Related U.S. Application Data

(60) Provisional application No. 62/035,056, filed on Aug. 8, 2014, provisional application No. 62/067,660, filed on Oct. 23, 2014.

(51) Int. Cl.
*H01L 33/24* (2010.01)
*H01L 27/15* (2006.01)
(Continued)

(52) U.S. Cl.
CPC ............ *H01L 27/156* (2013.01); *H01L 33/24* (2013.01); *H01L 33/38* (2013.01); *H01L 33/44* (2013.01);
(Continued)

(58) Field of Classification Search
CPC ................................ H01L 33/08; H01L 33/24
See application file for complete search history.

(56) References Cited

U.S. PATENT DOCUMENTS 8,350,251 B1   1/2013   Lowgren et al.
8,669,125 B2   3/2014   Lowgren et al.
(Continued)

FOREIGN PATENT DOCUMENTS

CN        188630 A       12/2006
JP     2007116097 A       5/2007
(Continued)

OTHER PUBLICATIONS

International Search Report and written Opinion for PCT/US2015/044049, dated Feb. 11, 2016.
(Continued)

*Primary Examiner* — Tucker J Wright
*Assistant Examiner* — Christopher A Culbert
(74) *Attorney, Agent, or Firm* — The Marbury Law Group, PLLC

(57) ABSTRACT

A pixelated display device and a method for making the same are disclosed. The device may include an array of nanowire LEDs located above a substrate. When the nanowire LEDs are initially grown, they may emit first-wavelength light proximally to the substrate and second-wavelength light distally from the substrate. The nanowires may remain as initially grown, in which case only second-
(Continued)

wavelength light is visible, or the second-wavelength light emitting portions may be etched away such that only first-wavelength light is visible.

6 Claims, 4 Drawing Sheets

(51) Int. Cl.
*H01L 33/38* (2010.01)
*H01L 33/44* (2010.01)
*H01L 33/16* (2010.01)

(52) U.S. Cl.
CPC ...... *H01L 33/16* (2013.01); *H01L 2933/0025* (2013.01); *H01L 2933/0066* (2013.01)

(56) References Cited

U.S. PATENT DOCUMENTS

| | | | |
|---|---|---|---|
| 8,785,905 | B1 | 7/2014 | Wang et al. |
| 9,054,233 | B2 | 6/2015 | Ohlsson et al. |
| 9,281,442 | B2 | 3/2016 | Romano et al. |
| 9,620,559 | B2 | 4/2017 | Schubert et al. |
| 9,748,437 | B2 | 8/2017 | Ohlsson et al. |
| 9,761,757 | B2 | 9/2017 | Romano et al. |
| 2005/0082543 | A1 | 4/2005 | Alizadeh et al. |
| 2005/0227391 | A1 | 10/2005 | Jin et al. |
| 2007/0041214 | A1 | 2/2007 | Ha et al. |
| 2008/0012030 | A1 | 1/2008 | Yoon et al. |
| 2008/0036038 | A1 | 2/2008 | Hersee et al. |
| 2008/0149946 | A1 | 6/2008 | Kim et al. |
| 2009/0189144 | A1 | 7/2009 | Quitoriano et al. |
| 2010/0006817 | A1 | 1/2010 | Ohlsson et al. |
| 2011/0309382 | A1 | 12/2011 | Lowgren |
| 2012/0135260 | A1 | 5/2012 | Jang et al. |
| 2013/0140521 | A1* | 6/2013 | Gilet ........................ H01L 33/04 257/13 |
| 2014/0117401 | A1* | 5/2014 | Herner ................ H01L 33/0095 257/99 |
| 2014/0131750 | A1 | 5/2014 | Peng et al. |
| 2014/0134769 | A1 | 5/2014 | Kim et al. |
| 2016/0093665 | A1 | 3/2016 | Schubert et al. |
| 2017/0170372 | A1 | 6/2017 | Schubert et al. |
| 2017/0221963 | A1 | 8/2017 | Gardner et al. |
| 2017/0236975 | A1 | 8/2017 | Romano et al. |
| 2017/0301825 | A1 | 10/2017 | Ohlsson et al. |

FOREIGN PATENT DOCUMENTS

| | | | |
|---|---|---|---|
| JP | 2009049209 | A | 3/2009 |
| KR | 100857410 | B1 | 9/2008 |
| KR | 10-2012-0052651 | A | 5/2012 |
| KR | 10-2014-0096970 | A | 8/2014 |
| WO | WO2007102781 | A1 | 9/2007 |
| WO | WO2008079079 | A1 | 7/2008 |
| WO | WO2010014032 | A1 | 2/2010 |
| WO | WO2011160051 | A2 | 12/2011 |
| WO | WO2014197799 | A1 | 12/2014 |
| WO | WO2015095049 | A1 | 6/2015 |
| WO | WO2016022824 | A1 | 2/2016 |
| WO | WO2016025325 | A1 | 2/2016 |

OTHER PUBLICATIONS

International Preliminary Report or Patentability and Written Opinion of the International Searching Authority for International Application No. PCT/US2015/044049, dated Feb. 23, 2017, 10 pages.
Hong et al., "Visible-Color-Tunable Light-Emitting Diodes," Adv. Mater. 2011, XX, 1-5.
Funato et al., "Monolithic Polychromatic Light-Emitting Diodes Based on InGaN Microfacet Quantum Wells Toward Tailor-Made Solid-State Lighting," Applied Physics Express, 1 (2008), 011106.
Ueda et al., "Mechanisms of Metalorganic Vapor Phase Epitaxy of InGaN Quantum Wells on GaN Microfacet Structures," Phys. Stat. Sol. (c) 4, No. 7, 2826-2829 (2007).
Neubert et al., "Dependence of in Mole Fraction in InGaN Facets," Phys. Stat. Sol. vol. 4, No. 7, pp. 2383-2386, (2007).
International Application No. PCT/US2011/040932, International Preliminary Report on Patentability, dated Jan. 3, 2013.
International Application No. PCT/US2014/041308, International Search Report and Written Opinion, dated Oct. 1, 2014, 10pgs.
International Application No. PCT/US2015/052318, International Search Report and Written Opinion, dated Jan. 8, 2016, 10pgs.
International Application No. PCT/US2015/052318, International Preliminary Report on Patentability and Written Opinion, dated Apr. 6, 2017, 7 pgs.
U.S. Appl. No. 15/814,993, filed Nov. 16, 2017, Glo AB.

* cited by examiner

PIXILATED DISPLAY DEVICE BASED UPON NANOWIRE LEDS AND METHOD FOR MAKING THE SAME

CROSS-REFERENCE TO OTHER APPLICATIONS

This application is a national phase application under 35 U.S.C. § 371 of international application PCT/US2015/044049, filed Aug. 6, 2015 which claims priority to U.S. provisional Application Nos. 62/035,056 and 62/067,660, filed on Aug. 8, 2014 and Oct. 23, 2014 respectively, the entire teachings of which are incorporated herein by reference.

RELATED APPLICATIONS

This application claims the benefit of priority to U.S. Provisional Application No. 62/035,056, filed on Aug. 8, 2014, and 62/067,660, filed on Oct. 23, 2014, the entire contents of which applications are incorporated herein by reference.

FIELD OF THE INVENTION

The present invention relates generally to the field of pixelated displays. More particularly, the present invention is directed to direct view LED displays using nanowire LEDs which emit first-wavelength light from a proximal end and second-wavelength light from a distal end.

BACKGROUND

In the field of pixelated displays, there exist several technologies. One technology is liquid crystal displays (LCD), wherein a backlight unit is provided which is illuminated with white light, a liquid crystal shutter array disposed over the backlight, and an array of red, green, and blue (or other colors) color filters is disposed over the liquid crystal shutter. This design is widely practiced. Variations on the technology include different levels of sophistication in the shutter array design, optimizing for transmission or speed of opening or closing the backlight shutters. The color filter array may be optimized for transmission or color gamut of the final display. The principal disadvantages of the LCD display are the relatively poor power efficiency of the display since the final screen brightness is typically 5% of the brightness of the backlight unit, and the poor color gamut that can be provided with reasonable efficiency (typically 70% of the NTSC color gamut). Another technology for pixelated displays is organic LEDs (OLEDs), wherein a substrate is provided, an array of driving circuits is disposed over the substrate (forming a backplane), and an array of red, green, and blue (or other colors) of organic LEDs is deposited on the backplane. The LEDs are typically optimized for color and brightness at a given power input. The principal disadvantages of this technology are relatively poor reliability of the organic LEDs, and the relatively poor efficiency of the LEDs particularly at high brightness levels. An advantage of OLED displays over LCDs is the larger color gamut that can be provided at reasonable power consumption.

SUMMARY

According to an aspect of the present disclosure, a pixilated display device is provided, which comprises a first nanowire light emitting diode (LED) located above a substrate. The first nanowire LED emits first-wavelength light from a first location and second-wavelength light having a longer wavelength than the first-wavelength light from a second location that overlies the first location and is more distal from the substrate than the first location. The first nanowire LED comprises an n-type inner portion containing an n-type material and at least partially surrounded by a p-type outer portion containing a p-type material. The pixilated display device further comprises a first anode contact structure that is in physical contact with the p-type outer portion of the first nanowire LED.

According to another aspect of the present disclosure, a method of forming a pixilated display device is provided. An array of nanowire LEDs is grown on a substrate including an n-type layer therein. Each nanowire LED in the array includes a vertical stack, from bottom to top, of a first-wavelength light emitting portion including a first material emitting a first-wavelength light and a second-wavelength light emitting portion including a second material emitting a second-wavelength light. While masking a first nanowire LED within the array with a patterned masking layer, a second-wavelength light emitting portion from a second nanowire LED within the array is removed. A cathode contact structure can be formed on the n-type layer. At least one anode contact structure can be formed by depositing and patterning a conductive material layer. An optically transparent insulator layer is formed over the substrate. Solder contact structures can be formed to the cathode contact structure and the anode contact structure, respectively, through the optically transparent insulator layer.

An embodiment described herein discloses a substrate; at least one nanowire light emitting diode (LED) located above the substrate, wherein the at least one nanowire LED emits first-wavelength light proximally to the substrate and second-wavelength light distally from the substrate when the at least one nanowire LED is initially grown. The at least one nanowire LED comprises an n-type material at least partially surrounded by a p-type material; and an optically transparent insulator located above the at least one nanowire LED.

In an embodiment, the LED nanowires may be grown from a growth mask. In an embodiment, the second-wavelength light emitting portion of a nanowire may be removed from the remainder of the nanowire such that the nanowire emits first-wavelength light. In an embodiment, an n-type connection may be provided to an n-type layer located below the growth mask. In an embodiment, a p-type connection may be provided through a via contact structure in an optically transparent insulator. In an embodiment, a connection to the anode contact structure is located above dummy LED nanowires. In an embodiment, the various nanowire LEDs may be grouped into sub-pixels, which may be in turn be grouped into pixels. An embodiment includes a method of making the device described in the embodiments.

DETAILED DESCRIPTION

Figure 1:
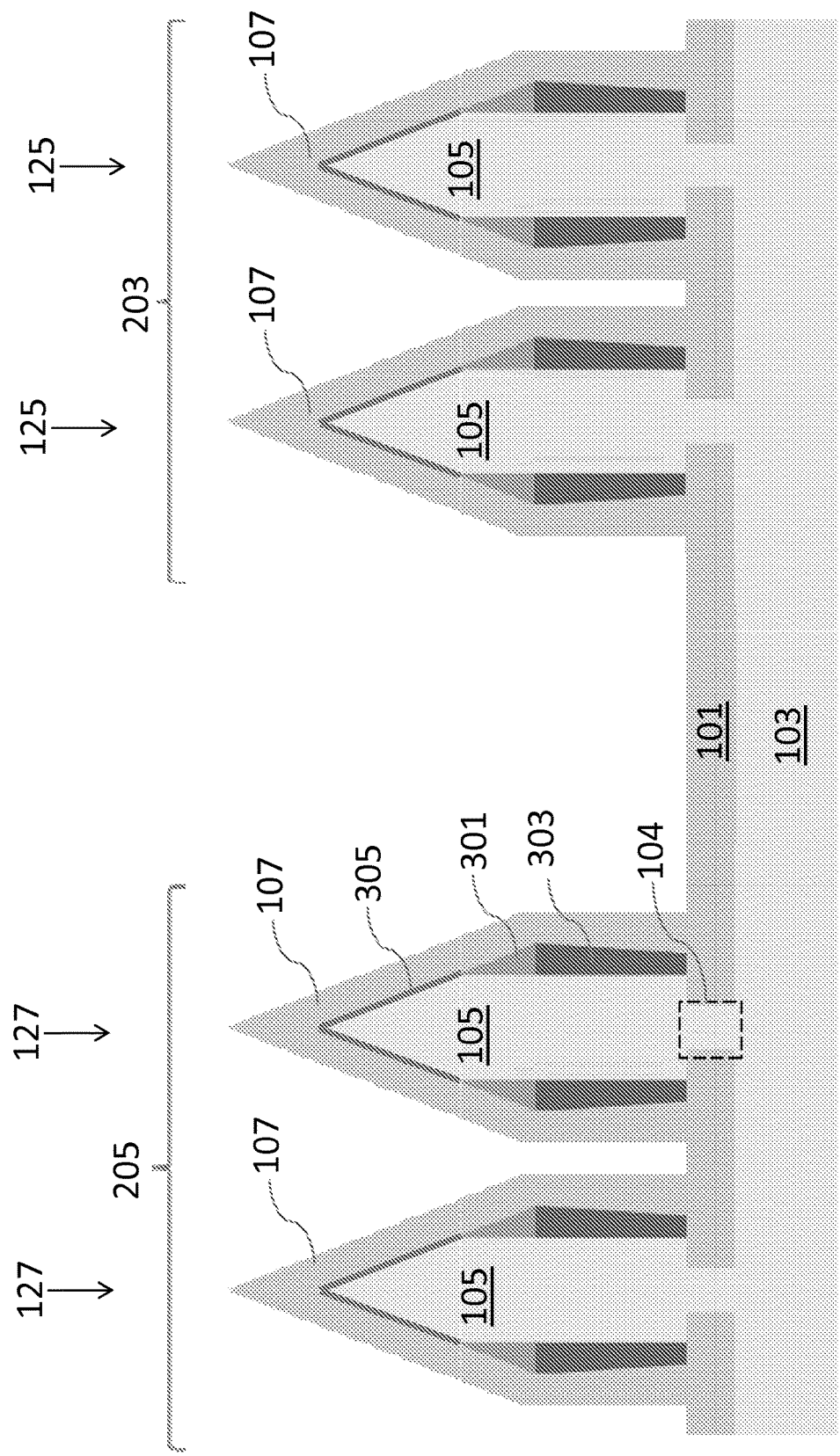
FIG. 1 is a side cross-section of an exemplary structure after formation of second-wavelength light emitting LED nanowires according to an embodiment of the present disclosure.

The various embodiments will be described in detail with reference to the accompanying drawing. Wherever possible, the same reference numbers will be used throughout the drawing to refer to the same or like parts. References made to particular examples and implementations are for illustrative purposes, and are not intended to limit the scope of the invention or the claims.

The drawings are not drawn to scale. Multiple instances of an element may be duplicated where a single instance of the element is illustrated, unless absence of duplication of elements is expressly described or clearly indicated otherwise. Ordinals such as "first," "second," and "third" are employed merely to identify similar elements, and different ordinals may be employed across the specification and the claims of the instant disclosure. As used herein, a first element located "on" a second element can be located on the exterior side of a surface of the second element or on the interior side of the second element. As used herein, a first element is located "directly on" a second element if there exist a physical contact between a surface of the first element and a surface of the second element.

As used herein, a "pixilated display device" refers to a device configured to display a bitmap such that individual pixels, which are small single-colored display elements, that comprise the bitmap display a graphic image.

As used herein, blue light refers to an electromagnetic radiation having a wavelength in a range from about 400 nm to about 495 nm.

As used herein, green light refers to an electromagnetic radiation having a wavelength in a range from about 495 nm to about 560 nm.

As used herein, a first-wavelength light refers to a light having a first wavelength; a second-wavelength light refers to a light having a second wavelength, and an i-th-wavelength light refers to a light having an i-th wavelength.

As used herein, "p-plane" means "pyramid plane" and represents a $\{1\bar{1}01\}$ plane in the III-nitride system, "c-plane" represents a $\{0001\}$ plane, and "m-plane" represents a $\{10\bar{1}0\}$ plane. Growth rate means layer growth rate when not otherwise specified.

As used herein, "kinetically limited growth regime" means a growth regime where growth rate predominantly is hindered by an energetic barrier (low temperature, cracking of source material, release of surface bonds etc.) to reach thermodynamic equilibrium. "Mass flow limited growth regime" means a growth regime where precipitation at the growth area is predominantly unhindered but growth rate is limited by concentration of source material at the growth area. "Group III limited growth regime" means a growth regime that is mass flow limited with regards to the column III element or elements while "group V limited growth regime" means a growth regime that is mass flow limited with regards to the column V element or elements.

A growth system is usually limited by a subset of these parameters in combination; i.e., a growth rate is often limited by source concentration even if a severe kinetic reaction barrier exists in the system. The relative weight of V to III limited growth rate is most easily adjusted by altering the total V/III-ratio. The relative weight of kinetical to mass flow limited growth rate is more complex, as it depends on the origin of the kinetical barrier. Usual parameters that change this are temperature, total pressure, total flow, carrier gas and V/III-ratio. It is also important to realize that in V/III growth where 50% of each element group is needed to proceed with precipitation, one group element can be kinetically limited while the other group elements are mass flow limited such that only one of the groups is causing the growth rate limitation. In traditional V/III growth, in metalorganic vapour phase epitaxy (MOVPE) and similar growth methods, high quality material is often grown with a high overflow of V material, for example, in GaN using V/III source gas mass flow ratio of at least 1,000, such as 1,000 to 10,000. Under these conditions, the growth rate is group III limited while the group V concentration is high to keep a saturated overflow of V material to the growth surface. In contrast, in the group V limited growth mode, the V/III ratio is preferably less than 1,000, such as 0.001 to 100, for example less than 1, such as 0.001 to 0.1.

To determine the type of growth rate limitation at a certain growth condition is relatively straightforward and is done by changing the condition parameters and recording the change in growth rate (e.g., thickness measurements). Energy heights of kinetic barriers can be deduced by temperature dependent growth rate measurements. It should be noted that growth rate variations may be caused by kinetic effects, such as improved local $NH_3$ cracking by increased exposure to GaN surface in the group V limited regime. However, growth rate response to mass flow and kinetic hindrance are not mutually exclusive in any way, except when all kinetic barriers are minimized.

The embodiments of the disclosure provide a substrate and a growth element (e.g., nanostructure core) protruding from the substrate. Preferably, the cores protrude from the substrate through apertures in a growth mask over the substrate. The nanostructure cores preferably have a lateral extension (i.e., diameter or width) of 3 μm or less in any lateral direction, for example 100 nm to 1 micron, and a height between 50 nm and 10 μm, such as 0.1 to 5 microns. Examples of nanostructure cores include nanowire (i.e., nanopillar) cores that are described below. As noted above, the nanostructure core itself or a nanostructure core with one or more shell layers forms the growth template. Furthermore, if desired, the growth substrate may be removed after the growth of the cores over the substrate, such that the finished device is a freestanding device or is mounted to a different handle substrate.

For the InGaN quantum well ("QW") active region, the higher growth rate of the InGaN semiconductor layer (e.g., QW shell on a semiconductor nanostructure core) results in higher indium incorporation into the quantum well. A higher indium incorporation results in a narrower band gap of the QW semiconductor material and thus in a longer emitted peak wavelength by the LED (i.e., a red shift in the emitted color).

Referring to FIG. 1, an array of nanowire LEDs (125, 127) can be grown on a substrate including an n-type layer 103 therein according to an embodiment of the present disclosure. Each nanowire LED (125, 127) in the array includes a vertical stack, from bottom to top, of a first-wavelength light emitting portion 303 and a second-wavelength light emitting portion 301. The LED nanowires (125, 127) may emit both second-wavelength light and first-wavelength light when initially grown. Second-wavelength light may be emitted from the second-wavelength light emitting portion 301 of the nanowire LEDs (125, 127) and first-wavelength light may be emitted from the first-wavelength light emitting portion 303 of the nanowire LEDs (125, 127). Second-wavelength light emitting portion 301 may be located distally from the growth mask 101, and first-wavelength light emitting portion 303 may be located proximally to the growth mask 101. This effect may occur where the concentration of indium varies over the length of nanowire LEDs (125, 127). For example, the percentage of Indium may be minimized near the end of the nanowire which is proximal to the growth mask, resulting in the emission of first-wavelength light. In contrast, the percentage of Indium may be maximized near the end of the nanowire which is distal from the growth mask, resulting in the emission of second-wavelength light. A pyramidal plane quantum well layer 305 can be located on pyramidal surfaces of an n-type inner portion 105. The pyramidal plane quantum well layer 35 can have the same number of alternating quantum well layers as each of the second-wavelength light emitting portion 301 and the first-wavelength light emitting portion 304, but the thickness of the pyramidal quantum well layer 35 can be less than the thicknesses of the second-wavelength light emitting portion 301 and the first-wavelength light emitting portion 303 at least by a factor of 2, and in some embodiments, by a factor of 4 or more.

The nanowire is thus engineered so that a portion of the nanowire LED has a bandgap corresponding to a first, shorter wavelength (e.g., first-wavelength light), and a second portion of the nanowire LED has a bandgap corresponding to a second, longer wavelength (e.g., green). In some subpixels, these two portions may be driven in parallel; emission from the small-bandgap long-wavelength active region is energetically favored. Therefore, although both portions of the active region are driven, light emission from the long-wavelength portion will dominate. In other subpixels, the long-wavelength portion of the wire is removed by a fabrication process, and so these subpixels will generate only the short-wavelength light. In this way, an array of subpixels emitting light of different colors can be realized.

The nanowire LEDs (125, 127) may be grown from an n-type layer 103 (e.g., n-type GaN) through growth mask 101. The growth mask may comprise any material known in the art, and may comprise, for example, silicon oxide or silicon nitride. The n-type layer 103 may protrude through growth mask 101 and form the n-type inner portion 105 of nanowire LEDs (125, 127). A p-type outer portion 107 (e.g., p-type GaN) may be provided around the n-type inner portion 105. Each n-type inner portion 105 can be connected to the n-type layer through a via connection 104 which passes through the growth mask 101, which can be a patterned dielectric material layer.

Figure 2:
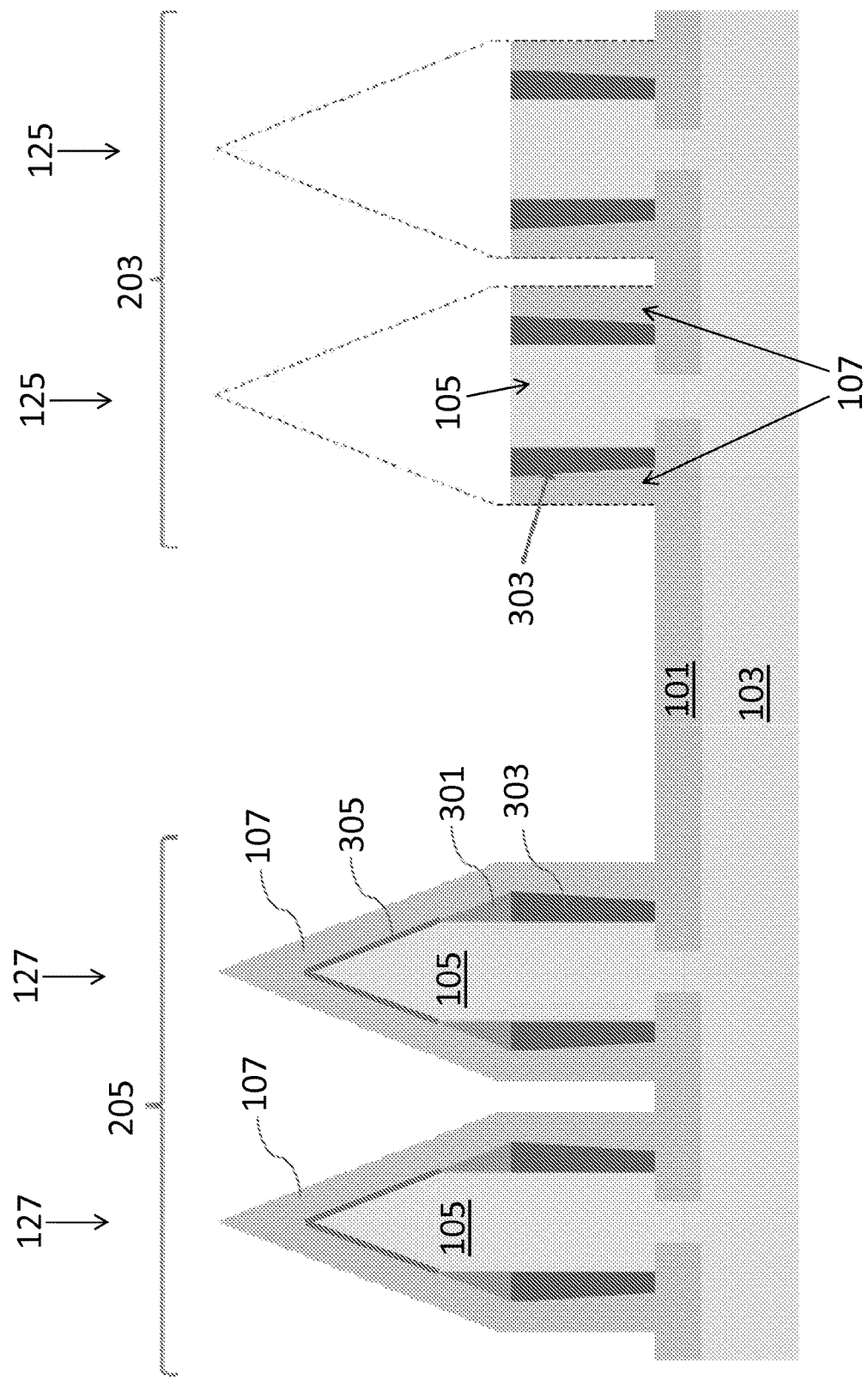
FIG. 2 is a side cross-section of the exemplary structure after formation of a combination of second-wavelength light emitting nanowires and first-wavelength light emitting nanowires according to an embodiment of the present disclosure.

Referring to FIG. 2, second-wavelength light emitting portions 301 may be removed to form nanowire LEDs 125. Specifically, while masking first nanowire LEDs 127 within the array with a patterned masking layer (not shown), second-wavelength light emitting portions 301 can be removed from second nanowire LEDs within the array. The patterned masking layer can be, for example, a patterned photoresist layer that is employed as a protective etch mask during an etch process employed to remove the second-wavelength light emitting portions 301.

The dashed lines surrounding nanowire LEDs 125 indicate the shape of the nanowire LEDs before the second-wavelength light emitting portions 301 are removed. Nanowire LEDs 125 may emit substantially first-wavelength light when the second-wavelength light emitting portions 301 no longer obstruct the first-wavelength light emitting portions 303. Multiple first-wavelength light emitting nanowires 125 may comprise a blue sub-pixel 203 and multiple second-wavelength light emitting nanowires 127 may comprise a green sub-pixel 205. Blue and green sub-pixels 203, 205 may in turn comprise a pixel.

Although FIGS. 1 and 2 illustrate second-wavelength light emitting nanowire LEDs 205 as adjacent to each other and first-wavelength light emitting nanowire LEDs 203 as adjacent to each other, in general second-wavelength light emitting nanowire LEDs 205 and first-wavelength light emitting nanowire LEDs 203 may be arranged in any pattern or method of organization. Further, a pixel may be comprised of any combination and/or orientation of first-wavelength light emitting nanowire LEDs and/or second-wavelength light emitting nanowire LEDs.

When utilizing nanowire growth as first step for templates for 3D structures, the structure size and shape is still coupled to spacing and aperture size (local $A_g/A_m$) under Group III limited conditions. However, in embodiments of the disclosure, by utilizing group V limited conditions when growth rate is not limited by the Group III source material delivery, constant growth rate independent of spacing can also be achieved.

The same mechanisms as described above are true for mask aperture size. Aperture size will mainly affect template length and width, and especially in Group III-source material limited growth regimes, the template can be grown at a length independent of aperture size.

As described above, a method of making nanowire LEDs includes defining a growth mask with a desired aperture pattern on a substrate. The growth mask can be a layer covering the substrate having apertures of different size and/or different spacing, the openings being grouped according to certain rules for obtaining the desired properties described above. The templates are selectively grown in growth regimes such that the lengths of the templates can be essentially independent of aperture spacing.

When templates have been grown as desired (i.e., a plurality of nanowires) at least one radial layer (e.g., active region and shell) are grown on the templates. As shown previously, the templates can also be fabricated where height can be made dependent or independent on aperture pitch depending on growth regime. This is also true for aperture size. Aperture size will then mainly affect template length and width, but length can be made independent of aperture size.

At extreme conditions, where group III flow is high, as in many nanowire conditions, growth with small $A_m$, as with extremely large apertures, is however not feasible, and will result in low quality growth and often liquid III element droplets form on the surface.

In nanowire growth, when growth is not rate limited by the Group III source material delivery, constant growth rate independent of spacing can also be achieved.

The same mechanisms as described above are true for mask aperture size. Aperture size will mainly affect template length and width, and especially in Group III-source material limited growth regimes, the template can be grown at a length independent of aperture size.

The apertures in the mask will normally have circular shape although other shapes are possible, such as hexagonal, or rectangular. Mask aperture size can be in the range of 10 nm-500 nm ("effective diameter"), or area 150 nm$^2$-0.5 µm$^2$.

In one embodiment, each nanowire LED (125, 127) can comprise a core-shell nanowire device that includes an n-type inner portion 105 as a core, and a quantum well shell (301, 303, 305) including the combination of a second-wavelength light emitting portion 301, a first-wavelength light emitting portion 303, and a pyramidal plane quantum well 305. In one embodiment, the n-type inner portion 105 can be formed by a selective epitaxy of GaN, which naturally grows as a pillar with a pointed tip at an upper end thereof. The n-type inner portion 105 can have hexagonal crystallographic facets. The quantum well shell (301, 303, 305) can be formed by alternate deposition of InGaN layers and GaN layers so that a stack of laterally alternating layers of InGaN layers and GaN layers is formed around the n-type inner portion 105. The second-wavelength light emitting portion 301 and the first-wavelength light emitting portion 303 formed on sidewall surfaces of the n-type inner portion 105 are thicker than the pyramidal plane quantum well 305 due to growth kinetics.

The growth kinetics of the quantum well formation process causes the indium atoms to be clustered at an upper end of the quantum well shell (301, 303, 305) that adjoins the bottom edge of the pointed tip of the n-type inner portion 105. Thus, the topmost portion of the quantum well shell (301, 303, 305) includes a higher concentration of indium, and emits second-wavelength light, thus becoming a second-wavelength light emitting portion. The rest of the quantum well shell (301, 303, 305) includes a lower concentration of indium, and emits first-wavelength light, thus becoming a first-wavelength light emitting portion. A thin layer (not shown) of quantum well shell can be formed on the surfaces of the pointed tip of the n-type inner portion 105.

The green-light emitting portion 301 is formed as an eave region. In other words, the corner of the nanowire shell (i.e., the quantum well shell (301, 303, 305)) where a vertical portion (which can be an m-plane portion) of the quantum well shell (301, 303) and the pyramidal plane quantum well 305 are adjoined is referred to as the "eave" or eave region. The green-light emitting portion 301 includes a structural discontinuity from the pyramidal plane quantum well 305 to a vertical portion (301, 303, 305) in the lower portion of the quantum well shell (301, 303, 305). The eave region has at least 5 atomic percent higher indium content than the first-wavelength light emitting portion 303 and the pyramidal plane quantum well 305. In one embodiment, the second-wavelength light emitting portion 301 is an indium rich In(Al)GaN region in the In(Al)GaN active region quantum well shell (301, 303, 305).

In one embodiment, each nanowire LED device (125, 127) can include a III-nitride semiconductor nanowire core (such as the n-type inner portion 105) having an upper tip portion with sloped p-plane sidewalls and a lower portion having substantially vertical m-plane sidewalls, and an indium containing III-nitride semiconductor shell (e.g., the quantum well shell (301, 303, 305)) located radially around the semiconductor nanowire core. The quantum well shell (301, 303, 305) comprises an upper tip portion (such as the pyramidal plane quantum well 305) with sloped p-plane sidewalls located over the upper tip portion of the nanowire core, and a lower portion (such as the first-wavelength light emitting portion 303) having substantially vertical m-plane sidewalls located over the lower portion of the nanowire core. The quantum well shell (301, 303, 305) also contains an eave region (e.g., the second-wavelength light emitting portion 301) which includes a structural discontinuity from the p-plane in the pyramidal plane quantum well 305 to the m-plane in the lower portion (such as the first-wavelength light emitting portion 303) of the quantum well shell (301, 303, 305). The p-type outer portion 107 constitutes an additional shell located on the outside of the quantum well shell (301, 303, 305).

The pyramidal plane quantum well 305 comprises a ring shaped region which surrounds an entire periphery of the upper tip portion of the nanowire core, which is the n-type inner portion 105. The first-wavelength light emitting portion 303 comprises a ring shaped region which surrounds an entire periphery of the lower portion of the nanowire core (i.e., the n-type inner portion 105). The second-wavelength light emitting portion 301 comprises a ring shaped region which surrounds an entire periphery of a middle portion of the nanowire core between the upper tip portion and the lower portion of the nanowire core. Thus, the second-wavelength light emitting portion 301 extends around the circumference of the nanowire to form a ring of substantially constant, elevated indium composition compared to the pyramidal plane quantum well 305 and the first-wavelength light emitting portion 303. Since III-nitride nanowires generally have a hexagonal cross sectional shape in the horizontal direction, the ring will have a substantially hexagonal cross sectional shape when viewed from above. The higher indium composition alloy (e.g., In(Al)GaN) can be preferentially deposited in the second-wavelength light emitting portion to enable longer wavelength devices for green (520 nm) and red (600 nm) LEDs.

The second-wavelength light emitting portion 301 has at least 5 atomic percent, such as at least 10 atomic percent, for example 10 to 30 atomic percent higher indium content than upper tip portion (i.e., the pyramidal plane quantum well 305) of the quantum well shell (301, 303, 305) having the sloped p-plane sidewalls and the lower portion (i.e., the first-wavelength light emitting portion 303) of the quantum well shell (301, 303, 305) having the substantially vertical m-plane sidewalls. For example, the second-wavelength light emitting portion 301 may contain 15-30 atomic percent indium, and the pyramidal plane quantum well 305 and the first-wavelength light emitting portion 303 may contain 15 atomic percent indium or less, such as 1 to 9 atomic percent indium.

The LED device containing the indium rich eave region, such as the second-wavelength light emitting portion 301, may have a red, orange, yellow or green peak emission wavelength, such as a 495 to 590 nm peak emission wavelength or a 591 to 650 nm peak emission wavelength. The longer the peak emission wavelength region, the higher the indium content of the eave region (e.g., the second-wavelength light emitting portion 301). For example, the indium content may be 15-22 atomic percent in the LED with a 495 to 590 nm peak emission wavelength range and 23-30 atomic percent in the LED with a 591 to 650 nm peak emission wavelength range. For example, when the LED has an about 520 nm peak emission wavelength, the eave region (e.g., the second-wavelength light emitting portion 301) may contain about 20 atomic percent indium and when the LED has an about 610 nm peak emission wavelength, the eave region (e.g., the second-wavelength light emitting portion 301) may contain about 30 atomic percent indium.

Without wishing to be bound by a particular theory, the present inventor believes that the indium rich In(Al)GaN eave region forms at the structural discontinuity between the p-plane and the m-plane portions of the quantum well shell (301, 303, 305). The discontinuity creates a low energy surface for In—N bonds to relax and incorporate indium with a higher probability than on the m-plane portion (such as the first-wavelength light emitting portion 303). In—N bonds have been shown to incorporate more readily in GaN when there is an available free surface. Thus, the indium rich eave region (i.e., the second-wavelength light emitting portion 301) is formed by self assembly during the formation of the quantum well shell (301, 303, 305).

The difference in indium composition between the second-wavelength light emitting portion 301 and the first-wavelength light emitting portion 303 of the quantum well shell (301, 303, 305) can be controlled by growth temperature, TMIn/TMGa flow ratio during deposition of the quantum well shell (301, 303, 305) by metal organic chemical vapor deposition (MOCVD), and/or ammonia flow during the deposition of the quantum well shell (301, 303, 305) by MOCVD. Decreasing the temperature is the most direct way to increase the indium content of the second-wavelength light emitting portion 301 relative to the first-wavelength light. The temperature effect is enhanced at a lower growth rate, where the growth rate is controlled by TMIn+TMGa/$NH_3$ ratio during MOCVD of the quantum well shell (301, 303, 305). Growth rate can increase the second-wavelength light emitting portion 301 relative to the first-wavelength light emitting portion 303 due to the high surface energy at the eave. For example, the thickness of the second-wavelength light emitting portion 301 may be 1.1 to 1.5 times greater than the thickness of the first-wavelength light emitting portion 303. Increasing the thickness of the InGaN quantum well shell (301, 303, 305) can also increase the indium content in the eave region by 1.5 to 5 times.

For example, the second-wavelength light emitting portion 301 may be at least 10 percent thicker, such as at least 20 percent thicker (including 20 to 35 percent thicker) than the first-wavelength light emitting portion 303 of the quantum well shell (301, 303, 305). The pyramidal plane quantum well 305 is usually thinner than both the eave region (e.g., the second-wavelength light emitting portion 301) and the m-plane portion (e.g., the first-wavelength light emitting portion 303). Emission from the high indium content eave region is believed to dominate as a function of current applied to the LED. For example, the eave region (e.g., the second-wavelength light emitting portion 301) may be 12 to 20 nm thick while the m-plane portion (e.g., the first-wavelength light emitting portion 303) of the quantum well shell (301, 303, 305) may be 7 to 11 nm thick. The pyramidal plane quantum well 305 of the quantum well shell (301, 303, 305) may be 0.4 to 2 nm thick.

High efficiency devices at the longer wavelengths (e.g., a green and longer peak wavelength) can be achieved by increasing the active region volume of the eave region. This can be done by increasing the nanowire diameter and/or the nanowire density on the substrate by decreasing the nanowire pitch.

Figure 3:
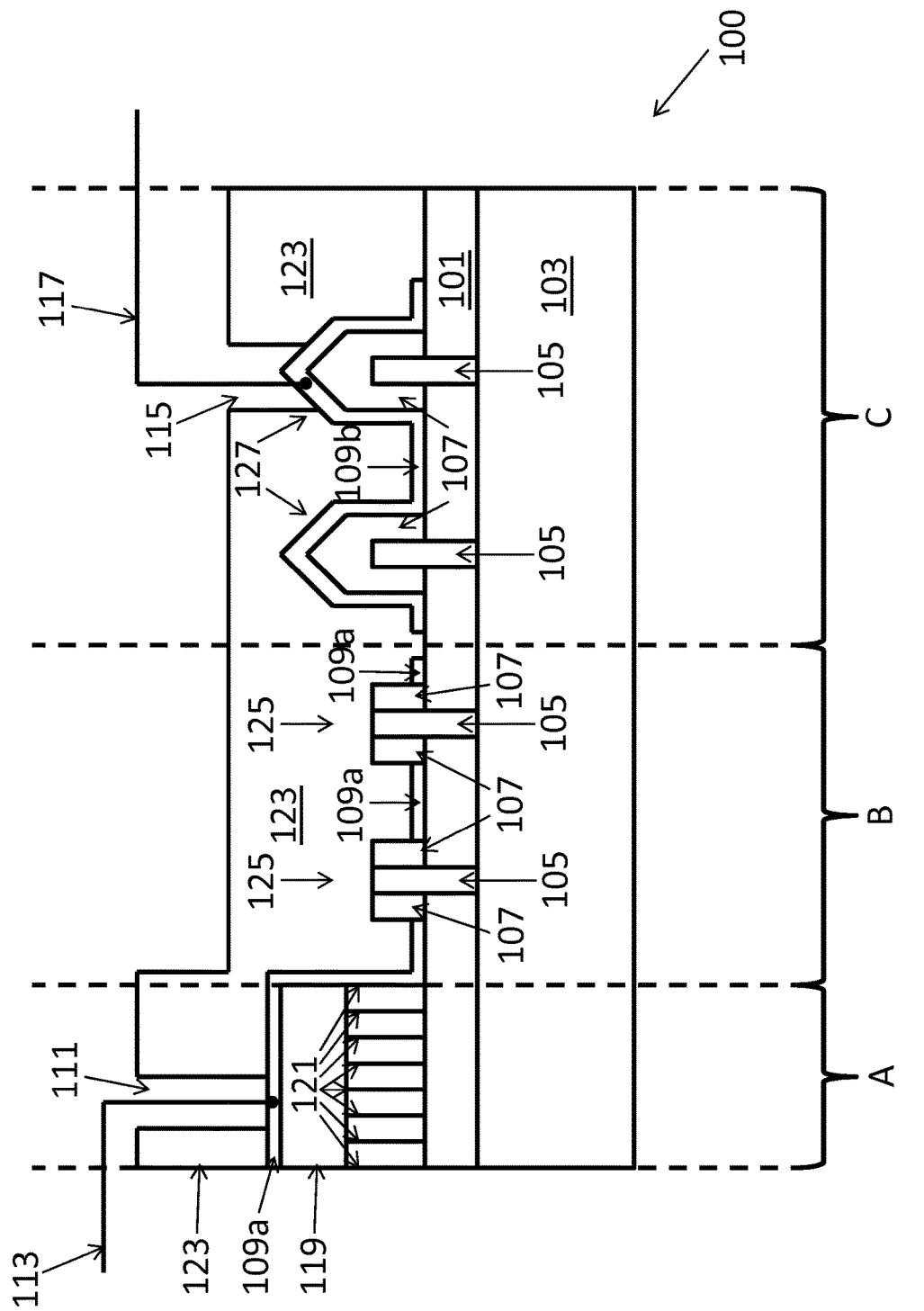
FIG. 3 is a side cross-section of a portion of an embodiment pixilated display device.

FIG. 3 is a side cross-section of a portion of an exemplary structure including a pixilated display device 100 according to an embodiment of the present disclosure. The nanowire LEDs (125, 127) illustrated in FIG. 2 may be incorporated into the exemplary structure of FIG. 3. As discussed above, an n-type layer 103 may be grown through a growth mask 101, protruding above the other side to form the n-type inner portion 105 of nanowire LEDs (125, 127). The distal ends (which contain a second-wavelength light emitting portion) of some nanowire LEDs 125 may have been removed. Thus, some nanowire LEDs 125 may emit substantially first-wavelength light. Meanwhile, some nanowire LEDs 127 may retain the distal end, and therefore emit substantially second-wavelength light. Although FIG. 3 illustrates two adjacent first-wavelength light emitting nanowire LEDs 125 and two adjacent second-wavelength light emitting nanowire LEDs 127, this depiction is merely illustrative. In fact, the pixilated device may include any arrangement of first-wavelength light emitting nanowire LEDs and/or second-wavelength light emitting nanowire LEDs.

Anode contact structures (109a, 109b) may be formed to provide electrical contact with the nanowire LEDs (125, 127). Each anode contact structure (109a, 109b) can be formed by depositing and patterning a conductive material layer. Anode contact structures (109a, 109b) comprise a conductive material, which can be a reflective material (which can be a reflective metal such as Au, Ag and/or Al) and/or transparent conductive oxide (e.g., Indium Tin Oxide and/or Al-doped Zinc Oxide). In an embodiment, multiple first-wavelength light emitting nanowire LEDs 125 may be in electrical contact with a common anode contact structure 109a. In an embodiment, multiple second-wavelength light emitting nanowire LEDs 127 may be in electrical contact with a common anode contact structure 109b. In an embodiment, the anode contact structure may be electrically disconnected at strategic locations such that multiple first-wavelength light emitting nanowire LEDs 125 and second-wavelength light emitting nanowire LEDs 127 do not share a common anode contact structure. It is understood that FIG. 3 schematically illustrates merely a portion of the pixelated display. Thus, many more via contact structures and nanowire LEDs may be located elsewhere above the growth mask.

FIG. 3 illustrates both first-wavelength light emitting nanowire LEDs 125 as sharing an anode contact structure 109a and both second-wavelength light emitting nanowire LEDs 127 as sharing a single anode contact structure 109b, where anode contact structures (109a, 109b) are not in electrical contact with each other. However, in general any number of LEDs may share any number of anode contact structures. Further, LEDs may share an anode contact structure regardless of the color of light they emit. For example, one or more first-wavelength light emitting nanowire LED and/or one or more second-wavelength light emitting nanowire LED, such as one blue emitting nanowire LEDs and one second-wavelength light emitting nanowire LEDs, may share a single anode contact structure.

In an embodiment, a first optically transparent insulator layer 123 may be provided above portions of the LEDs (125, 127) and anode contact structure (109a, 109b). The optically transparent insulator layer may comprise any suitable material known in the art, such as $Al_2O_3$ or $SiO_2$. A via cavity may be provided in the first optically transparent insulator layer 123 to expose the anode contact structure 109b.

Solder contact structures (113, 117) can be formed to the cathode contact structure 201 and each anode contact structure (109a, 109b), respectively, through the first optically transparent insulator layer 123. For example, a solder contact structure 117 may be in electrical contact with the anode contact structure 109b. Thus, solder contact structure 117 allows for the control of current through second-wavelength light emitting nanowire LEDs. A via cavity may be provided in the first optically transparent insulator layer 123 to expose the anode contact structure 109a. A solder contact structure 113 may be in electrical contact with the anode contact structure 109a. Thus, solder contact structure 113 allows for the control of current through first-wavelength light emitting nanowire LEDs 125. However, note that any number of via contact structures and/or solder contact structures may be provided to any variety of locations. In this way, the current in any combination of the LEDs for any given pattern or method of organization of LEDs may be controlled.

An embodiment may optionally include an anode contact structure 109a located above dummy nanowire LEDs 121 and a second optically transparent insulator layer 119 similar to the first optically transparent insulator layer 123. The dummy LEDs may be similar to nanowire LEDs (125, 127)

except that the dummy LEDs are not provided with a pair of electrical contacts to the anode and the cathode. Thus, the dummy LEDs are configured as LEDs, but are not capable of emitting light due to lack of suitable electrical contacts. As will be explained in further detail in the discussion of the method of making embodiments, it may be more efficient and cost-effective to simply deposit anode contact structure 109a above dummy nanowire LEDs 121 rather than etching away dummy LEDs 121 and then depositing anode contact structure 109a on the same vertical level as the anode contact structure 109a located between the two first-wavelength light emitting nanowire LEDs 125. If dummy LEDs 121 are utilized, they may not be in electrical contact with anode contact structure 109a, and therefore may not emit visible light. Any number of dummy LEDs may comprise a single group of dummy LEDs. Further, although FIG. 3 depicts dummy LEDs 121 as being located beneath a single via cavity 111 corresponding to first-wavelength light emitting nanowire LEDs 125, in general dummy LEDs may be located anywhere above the growth mask 101. Additionally, the number of groups of dummy LEDs may be any number, and is not limited to one as is illustrated in FIG. 3. The patterned portion of the second optically transparent insulator layer over the dummy LEDs constitutes an optically transparent insulator material portion.

FIG. 3 also divides the illustrated embodiment into regions A, B, and C, denoted by dashed lines. Region A may comprise a portion of solder contact structure 113, a via cavity 111, a portion of the first optically transparent insulator layer 123, a portion of anode contact structure 109a, a second optically transparent insulator layer 119, dummy LEDs 121, a portion of growth mask 101, and a portion of n-type layer 103. Region B may comprise a portion of the first optically transparent insulator layer 123, first-wavelength light emitting nanowire LEDs 125, a portion of anode contact structure 109a, a portion of growth mask 101, and a portion of n-type layer 103. Region C may comprise a portion of solder contact structure 117, a via cavity 115, second-wavelength light emitting nanowire LEDs 127, a portion of anode contact structure 109b, a portion of growth mask 101, and a portion of n-type layer 103.

The exemplary structure of FIG. 3 includes a pixilated display device that comprises at least a first nanowire light emitting diode (LED) 127 located above a substrate. The first nanowire LED 127 emits first-wavelength light from a first location (i.e., the location of a first-wavelength light emitting portion 303), and emits second-wavelength light from a second location (e.g., the location of a second-wavelength light emitting portion 301) that overlies the first location and is more distal from the substrate than the first location. The first nanowire LED 127 comprises an n-type inner portion 105 containing an n-type material and at least partially surrounded by a p-type outer portion 107 containing a p-type material. The pixilated display device further includes a first anode contact structure 109b that is in physical contact with the p-type outer portion 107 of the first nanowire LED 127.

The pixilated display device can further comprise a second nanowire LED 125 located above the substrate. The second nanowire LED 123 is configured to emit only second-wavelength light and not to emit any first-wavelength light. The second nanowire LED 125 does not include the material of the second-wavelength light emitting portion 301 of the first nanowire LED 127. In one embodiment, the second nanowire LED 125 does not include any second-wavelength light emitting material. Each of the first nanowire LED 127 and the second nanowire LED 125 comprises a first-wavelength light emitting portion 303 having the same material composition. The second nanowire LED 125 comprises a second n-type inner portion 105 containing the n-type material, and a second p-type outer portion 107 containing the p-type material.

A first optically transparent insulator layer 123 can be in contact with sidewalls of the p-type outer portion 107 located on the first nanowire LED 127 and in contact with a top surface of the first-wavelength light emitting portion 303 of the second nanowire LED 125. The first optically transparent insulator layer 123 can contact a top surface of an n-type inner portion 105 of the second nanowire LED 125. The pixilated display device further comprises an n-type layer 103 located within the substrate and including the same semiconductor material as the n-type material of the n-type inner portion 105. In one embodiment, the n-type inner portion 105 can be electrically connected to the n-type layer through a via connection 104 which passes through the growth mask 101.

In one embodiment, the first anode contact structure 109b contacts an entire outer sidewall and an entire top surface of the p-type outer portion 107 of the first nanowire LED 127. In one embodiment, a second anode contact structure 109a can be in physical contact with a second p-type outer portion 107 contained within the second nanowire LED 125. The second anode contact structure 109a can comprise the same material as the first anode contact structure 109b, and can have the same thickness as the first anode contact structure 109b.

The pixilated display device can further comprise at least one dummy LED 121 located over the substrate, and a second optically transparent insulator layer 119 overlying the at least one dummy LED 121. A portion of the second anode contact structure 190a can be located above the second optically transparent insulator layer 119. An additional optically transparent insulator layer, such as the first optically transparent insulator layer 123, can be in contact with a top surface of a first-wavelength light emitting portion of the second nanowire LED 125. A solder contact structure 117 can run through a via cavity 115 in the additional optically transparent insulator layer.

In one embodiment, at least one additional first nanowire LED 127 that emits first-wavelength light and second-wavelength light can be located over the substrate. The first anode contact structure 109b can electrically connect the p-type outer portion 107 of the first nanowire LED 127 and each p-type outer portion 107 of the additional first nanowire LED 127.

The pixilated display device can further comprise the second anode contact structure 109a having the same composition as the first anode contact structure 109b, contacting a p-type outer portion 107 of the second nanowire LED 125, not overlying a top surface of the second nanowire LED 125, and electrically isolated from the p-type outer portion 107 of the first nanowire LED 127. In one embodiment, the first optically transparent insulator layer 123 can be formed directly on a surface of a second-wavelength light emitting portion 303 of the second nanowire LED 125. In one embodiment, the at least one anode contact structure (109a, 109b) can comprises a first anode contact structure 109b that contacts an entirety of a sidewall and a top surface of the first nanowire LED 127.

Figure 4:
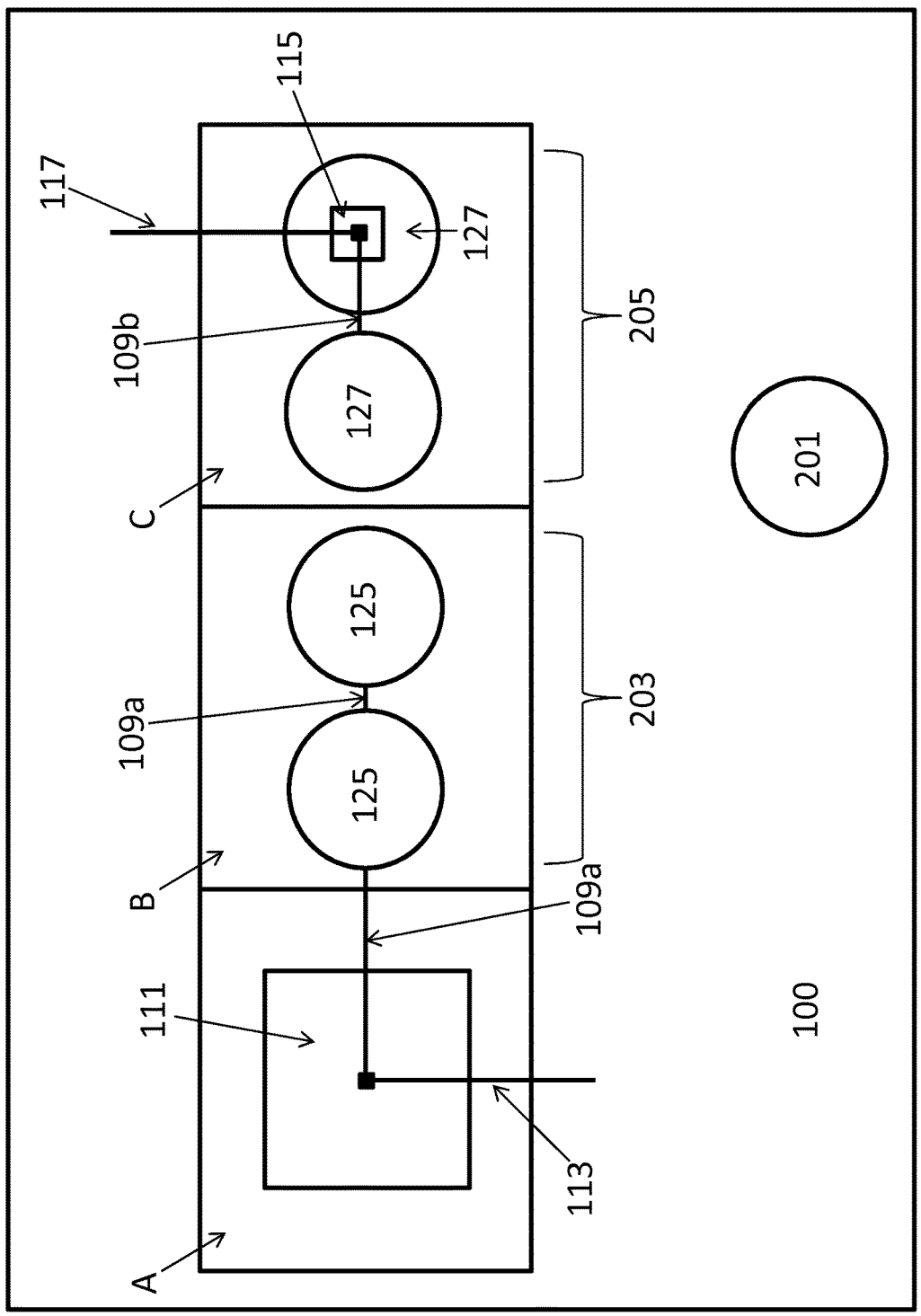
FIG. 4 is a top cross-section of an embodiment pixilated display device.

FIG. 4 illustrates a top cross sectional view of a portion of an embodiment pixilated display 100. Regions A, B, and C may comprise the same components as described in FIG. 3. Per FIG. 4, region A may comprise a via cavity 111, solder contact structure 113, and a portion of anode contact structure 109*a*. Anode contact structure 109*a* may extend from region A to first-wavelength light emitting nanowire LEDs 125 in region B. Region B may comprise both first-wavelength light emitting nanowire LEDs 125, thereby comprising blue sub-pixel 203. Region C may comprise a via cavity 115, solder contact structure 117, anode contact structure 109*b*, and both second-wavelength light emitting nanowire LEDs 127. Region C may thus comprise green sub-pixel 205. However, sub-pixels may comprise any number of blue and/or green nanowire LEDs, and may vary from sub-pixel to sub-pixel depending upon the organization of blue and second-wavelength light emitting LEDs over the device 100. Further, the nanowire LEDs and sub-pixels may extend over a substantial portion of the device 100 as an array capable of forming pixels and displaying images.

FIG. 4 also illustrates the cathode contact structure 201. The cathode contact structure 201 can be formed through the first optically transparent insulator layer 123 to the n-type layer 103. The cathode contact structure 201 may comprise a metal stack (e.g., Al and/or Ti and/or Au) in electrical contact with n-type layer 103 of FIG. 3. The cathode contact structure 201 may be provided through a via cavity in the first optically transparent insulator layer 123 of FIG. 3, a portion of the nanowire LED array (potentially including the p-type layer (109*a*, 109*b*)), and growth mask 101. The cathode contact structure 201 may protrude from the via cavity, allowing for electrical control over the n-type layer 103. Cathode contact structure 201 may comprise any suitable metal known in the art, such as Au, AuSn, or SAC305.

In an embodiment, a method for forming the pixilated display device 100 may comprise providing an array of nanowire LEDs. The nanowire LEDs may be grown on a growth substrate 101 located above an n-type layer The nanowire LEDs may comprise a second-wavelength light emitting portion 301 located distally from the growth substrate 101 and a first-wavelength light emitting portion located proximally to the growth substrate 101.

In an embodiment, a second optically transparent insulator layer 119, such as a thin conformal dielectric layer, may then be deposited on the entirety of the substrate 101 and nanowire LEDs. The second optically transparent insulator layer 119 may be deposited by any of several methods known in the art, such as atomic layer deposition of $Al_2O_3$ or electron beam deposition of $SiO_2$. In an embodiment, the second optically transparent insulator layer 119 may be removed from all of the substrate 101 and nanowire LEDs but a relatively small portion. Those nanowire LEDs covered by the second optically transparent insulator layer 119 may be dummy LEDs 121 because they are isolated from a p-type connection. Alternatively, rather than depositing a second optically transparent insulator layer 119 over of the substrate the dummy LEDs 121 may be etched away. However, depositing the second optically transparent insulator layer 119 may be economically advantageous as well as time-saving because etching away dummy LEDs 121 may comprise an involved, expensive, and time-consuming process.

In an embodiment, cathode contact structure 201 may be provided in electrical contact with n-type layer 103. As described above in conjunction with FIG. 4, the cathode contact structure 201 may comprise a metal stack (e.g., Al and/or Ti and/or Au). To contact the cathode contact structure 201 with n-type layer 103, a portion of the nanowire array, including the substrate 101 and/or nanowire LEDs, may be etched away, thereby exposing the n-type layer 103 below. If the cathode contact structure 201 is provided before the second optically transparent insulator layer 119 is removed, the second optically transparent insulator layer 119 may be removed to expose the n-type layer 103 as well. After a via cavity to the n-type layer 103 is formed, the metal stack may be inserted and placed in contact with n-type layer 103 so as to comprise an cathode contact structure 201.

An anode contact structure layer may then be deposited over the entirety of the substrate 101, including nanowire LEDs 127. Certain portions of the anode contact structure layer may then be removed. In an embodiment, portions of the anode contact structure layer may remain over nanowire LEDs. Portions of the anode contact structure layer may further remain over portions of the substrate 101 such that certain nanowire LEDs are in electrical contact with each other, thereby forming anode contact structures (109*a*, 109*b*). If dummy nanowire LEDs 121 are not etched away, the anode contact structure layer may also remain over the second optically transparent insulator layer 119. If dummy nanowire LEDs 121 are etched away, anode contact structure 109*a* may be deposited above the substrate 101 in region A.

In an embodiment, the second-wavelength light emitting portions 301 of at least some nanowire LEDs 125 may be removed. In a non-limiting illustrative example, a temporary masking layer (such as a photoresist layer) may be applied over the LEDs (125, 127), and may be lithographically patterned to cover the LEDs 127, while the LEDs 125 are not covered by the temporary masking layer. In one embodiment, the temporary masking layer can be applied and patterned after deposition of a conductive material layer over the exemplary structure illustrated in FIG. 1. An etch process is performed to remove the an upper portion of the p-type outer portion 107 and the second-wavelength light emitting portion 301 from each second nanowire LED 125. The etch process may be an anisotropic etch process such as reactive ion etching or inductively coupled plasma etching. In a non-limiting illustrative example, an upper portion of each p-type outer portion 107, each second-wavelength light emitting portion 301, and an upper portion of each n-type inner portion 105 can be vertically recessed and removed by an anisotropic etch process that employs the temporary masking layer as an etch mask. The temporary mask layer can be subsequently removed, for example, by ashing.

In one embodiment, the application and patterning of the temporary masking layer can be performed after deposition of a conductive material layer, which is subsequently patterned to form the various anode contact structures (109*a*, 109*b*). The portions of the conductive material layer that is not covered by the temporary masking layer can be removed during the anisotropic etch that removes the upper portions of the p-type outer portions 107 and the second-wavelength light emitting portions 301 from the second nanowire LEDs 125. In another embodiment, the conductive material layer can be deposited and patterned after the anisotropic etch that removes the upper portions of the p-type outer portions 107 and the second-wavelength light emitting portions 301 from the second nanowire LEDs 125. The periphery of the openings in the temporary masking layer can be within the outer periphery of each second nanowire LED 125 so that the portions of the conductive material layer overlying the second nanowire LEDs 125 can be removed.

Because LEDs 125 may still have first-wavelength light emitting portions 303, nanowire LEDs 125 may emit substantially first-wavelength light. The nanowire LEDs 127 whose second-wavelength light emitting portions 301 are not etched away may emit substantially second-wavelength light. FIGS. 1-4 show a specific layout for the substantially first-wavelength light emitting nanowire LEDs 125 and the substantially second-wavelength light emitting nanowire LEDs 127 (i.e., two substantially first-wavelength light emitting nanowire LEDs 125 adjacent to two substantially second-wavelength light emitting nanowire LEDs 127). However, in general any nanowire LEDs within the nanowire LED array may be etched to form any pattern or arrangement of substantially first-wavelength light emitting nanowire LEDs 125 and substantially second-wavelength light emitting nanowire LEDs 127. The anode contact structure layer may be etched away in particular places on the array to facilitate any particular arrangement.

A first optically transparent insulator layer 123, such as a thin conformal dielectric layer, may then be deposited over the entirety of the substrate, including over the substantially first-wavelength light emitting nanowire LEDs 125 and the substantially second-wavelength light emitting nanowire LEDs 127. The first optically transparent insulator layer 123 may be substantially similar in composition to the second optically transparent insulator layer 119. The first optically transparent insulator layer 123 may be removed from above portions of the substrate. The removal may be accomplished through any etching procedure known in the art. It may be preferable to remove portions of the first optically transparent insulator layer 123 such that every portion of the anode contact structure layer is exposed. For example, in FIG. 3 both anode contact structure 109a and 109b are exposed. The volume of the removed portions of the second optically transparent insulator layer 119 may form via cavities, such as via cavities 111 and 115. Solder contact structure metal stacks 113, 117 may be deposited in the via cavities 111, 115 so as to form via contact structures that contact portions of the anode contact structure layer, such as anode contact structures (109a, 109b).

The foregoing method descriptions are provided merely as illustrative examples and are not intended to require or imply that the steps of the various embodiments must be performed in the order presented. As will be appreciated by one of skill in the art the order of steps in the foregoing embodiments may be performed in any order. Words such as "thereafter," "then," "next," etc. are not necessarily intended to limit the order of the steps; these words may be used to guide the reader through the description of the methods. Further, any reference to claim elements in the singular, for example, using the articles "a," "an" or "the" is not to be construed as limiting the element to the singular.

Further, any step of any embodiment described herein can be used in any other embodiment. The preceding description of the disclosed aspects is provided to enable any person skilled in the art to make or use the present invention. Various modifications to these aspects will be readily apparent to those skilled in the art, and the generic principles defined herein may be applied to other aspects without departing from the scope of the invention. Thus, the present invention is not intended to be limited to the aspects shown herein but is to be accorded the widest scope consistent with the principles and novel features disclosed herein.

What is claimed is:

1. A method of forming a pixilated display device, comprising:
  growing an array of nanowire LEDs on a substrate, each nanowire LED in the array including a vertical stack, from bottom to top, of a first-wavelength light emitting portion including a first material emitting a first-wavelength light and a second-wavelength light emitting portion including a second material emitting a second-wavelength light; and
  while masking a first nanowire LED within the array with a patterned masking layer, removing a second-wavelength light emitting portion from a second nanowire LED within the array;
  wherein growing the array of nanowire LEDs on the substrate comprises:
    forming a growth mask over the substrate, the growth mask having a first aperture in a first area of the first nanowire LED and a second aperture in a second area of the second nanowire LED;
    forming a first nanowire core through the first aperture; and
    forming a second nanowire core through the second aperture:
  wherein:
    the first nanowire LED comprises a core-shell nanowire device that comprises the first nanowire core and a first quantum well shell comprising the first-wavelength light emitting portion, the second-wavelength light emitting portion, and a first pyramidal plane quantum well;
    the second nanowire LED comprises a core-shell nanowire device that comprises the second nanowire core and a second quantum well shell comprising the first-wavelength light emitting portion, the second-wavelength light emitting portion, and a second pyramidal plane quantum well;
    the first quantum well shell is formed by deposition of an InGaN layer and a GaN layer around the first nanowire core;
    the second quantum well shell is formed by deposition of the InGaN layer and the GaN layer around the second nanowire core;
    the first quantum well shell and the second quantum well shell are deposited during the same deposition steps;
    the first-wavelength light emitting portion of the first nanowire LED comprises a lower portion of the first quantum well shell located over m-plane sidewalls of the first nanowire core;
    the second-wavelength light emitting portion of the first nanowire LED comprises an eave region of the first quantum well shell located between the lower portion of the first quantum well shell and the first pyramidal plane quantum well of the first quantum well shell located over pyramidal p-plane sidewalls of the first nanowire core;
    the first-wavelength light emitting portion of the second nanowire LED comprises a lower portion of the second quantum well shell located over m-plane sidewalls of the second nanowire core; and
    the second-wavelength light emitting portion of the second nanowire LED comprises an eave region of the second quantum well shell located between the lower portion of the second quantum well shell and the second pyramidal plane quantum well of the second quantum well shell located over pyramidal p-plane sidewalls of the second nanowire core.

2. The method of claim 1, wherein:
  the InGaN layer in the cave region of the first quantum well shell has at least 5 atomic percent higher indium content than the InGaN layer in the lower portion of the first quantum well shell, such that the first-wavelength light emitting portion of the first nanowire LED emits blue light and the second-wavelength light emitting portion of the second nanowire LED emits green light;

the InGaN layer in the eave region of the second quantum well shell has at least 5 atomic percent higher indium content than the InGaN layer in the lower portion of the second quantum well shell; and removing the second-wavelength light emitting portion from a second nanowire LED within the array comprises removing the eave region of the second quantum well shell of the second nanowire LED while masking the first quantum well shell of the first nanowire LED.

3. The method of claim 2, wherein:

the eave region and the lower portion of the first quantum well shell are not removed from the first nanowire LED during the step of removing the second-wavelength light emitting portion from the second nanowire LED;

the lower portion of the second quantum well shell is not removed from the second nanowire LED during the step of removing the second-wavelength light emitting portion from the second nanowire LED;

the first nanowire LED emits green light; and the second nanowire LED emits blue light.

4. The method of claim 3, wherein:

the first nanowire LED is located in a green light emitting subpixel of a display device; and the second nanowire LED is located in a blue light emitting subpixel of the display device.

5. The method of claim 4, further comprising providing a red light emitting subpixel of the display device to form a red, green and blue light emitting pixel of the display device.

6. The method of claim 5, wherein the display device comprises a direct view display device.

* * * * *